United States Patent
Sung et al.

[11] Patent Number: 6,133,599
[45] Date of Patent: Oct. 17, 2000

[54] DESIGN AND A NOVEL PROCESS FOR FORMATION OF DRAM BIT LINE AND CAPACITOR NODE CONTACTS

[75] Inventors: Jan Mye Sung, Yang-Mei; Ing-Ruey Liaw, Chutung; Ming-Hong Kuo, Ping-Tung, all of Taiwan

[73] Assignee: Vanguard International Semiconductor Corporation, Hsin-Chu, Taiwan

[21] Appl. No.: 09/442,498

[22] Filed: Nov. 18, 1999

Related U.S. Application Data

[62] Division of application No. 09/053,536, Apr. 1, 1998, Pat. No. 6,008,085.

[51] Int. Cl.[7] .................. H01L 27/108; H01L 29/76; H01L 29/94; H01L 31/119
[52] U.S. Cl. .................. 257/296; 257/303; 257/306
[58] Field of Search .................. 438/253, 254, 438/255, 296, 396, 398; 257/296, 300, 303, 306, 307, 311, 532, 535, 906, 908

[56] References Cited

U.S. PATENT DOCUMENTS

| | | | |
|---|---|---|---|
| 5,308,741 | 5/1994 | Kemp | 430/312 |
| 5,532,090 | 7/1996 | Borodovsky | 430/5 |
| 5,532,114 | 7/1996 | Bae | 430/312 |
| 5,573,634 | 11/1996 | Ham | 156/659.11 |
| 5,705,838 | 1/1998 | Jost et al. | 257/296 |
| 5,811,849 | 9/1998 | Matsuura | 257/306 |
| 5,828,096 | 10/1998 | Ohno et al. | 257/306 |
| 5,866,453 | 2/1999 | Prall et al. | 438/253 |
| 6,005,268 | 12/1999 | Parekh et al. | 257/296 |

*Primary Examiner*—Donald L. Monin, Jr.
*Assistant Examiner*—Hoai Pham
*Attorney, Agent, or Firm*—George O. Saile; Stephen B. Ackerman

[57] ABSTRACT

A process for fabricating a DRAM cell has been developed, in which two interlaced patterns, each comprised of capacitor node contact holes and bit line contact holes, are independently created, each using a specific photolithographic mask, and a specific photolithographic procedure. The two interlaced patterns allow the creation of the capacitor node contact images, and the bit line contact holes images, to be formed in a thin polysilicon layer, with minimum spacing between contact images. Capacitor node contact holes, as well as bit line contact holes, are than formed in an insulator layer, via a dry etching procedure, using the patterned thin polysilicon layer as a mask. The use of specific masks, or of the interlaced pattern, allows the minimum spacing, between a capacitor node contact hole, and a bit line contact hole, to be limited only by the overlay between photolithographic masks.

4 Claims, 7 Drawing Sheets

DESIGN AND A NOVEL PROCESS FOR FORMATION OF DRAM BIT LINE AND CAPACITOR NODE CONTACTS

This is a division of patent application Ser. No. 09/053,536, filing date Apr. 1, 1998, now U.S. Pat. No. 6,008,085, A New Design And A Novel Process For Formation Of Dram Bit Line And Capacitor Node Contacts, assigned to the same assignee as the present invention.

BACKGROUND OF THE INVENTION (1) Field of the Invention

The present invention relates to a process used to fabricate a dynamic random access memory, (DRAM), cell, on a semiconductor substrate, and more specifically to a new design, and a new fabrication process, used to optimize the process and layout, of contact holes used for DRAM capacitor and bit line structures.

(2) Description of the Prior Art

In order to satisfy demands for high density DRAM semiconductor chips, micro-miniaturization, or the use of sub-micron features, used for DRAM designs, are employed. The attainment of micro-miniaturazation, or sub-micron features, has been mainly accomplished by advances in specific semiconductor fabrication disciplines, such as photolithography and dry etching. The use of more sophisticated exposure cameras, as well as the use of more sensitive photoresist materials, have allowed sub-micron images to be created in photoresist layers. In addition the development of more advanced dry etching tools and etch recipes, have allowed the sub-micron images in overlying photoresist layers to be successfully transferred to underlying materials, used in the creation of advanced semiconductor devices.

However to achieve DRAM cell densities of 1 gigabit, or greater, new designs, in addition to process enhancements, may be needed. One area of concern, using micro-miniaturization to achieve device density demands, is the use of smaller contact holes. The use of smaller contact holes is needed so that the minimum spacing between contact holes, is not decreased to a level in which photolithographic procedures, such as exposure and photoresist development, create risks in terms of yield. Therefore in order to achieve desired device densities, and not to enter beyond the minimum design spacing between contact holes, the size of the contact holes have to be decreased. Therefore conductive landing plugs, used to fill these smaller contact holes, are now more resistive, deleteriously influencing performance.

This invention will offer a new layout or design, as well as a new process, for DRAM contact holes, used for capacitor and bit line structures. An interlaced mask design and layout, using a first mask for a bit line contact hole, placed in a first cell, and capacitor node contact hole, placed in a neighboring second cell, followed by the use of a second mask, placing a bit line contact hole in the first cell, while placing a capacitor node contact hole in the neighboring second cell, allows larger contact hole sizes to be used, without sacrificing device density. The minimum spacing requirement, which is a concern when using a single mask, and a single photoresist layer, to create contact holes for both capacitor and bit line structures, in a specific cell, is not relevant in this invention. This invention features forming a combination of bit line contact hole images, and capacitor node contact hole images, in a thin polysilicon layer, using a first mask and a first photoresist layer, and then forming a second combination of bit line contact hole images and capacitor node contact hole image in the same thin polysilicon layer, using a second mask and a second photoresist layer. The patterned thin polysilicon layer is then used as a mask to open the desired contact holes, in an insulator layer, exposing active regions in the semiconductor substrate. The minimum spacing requirement, used between features in a single photoresist layer, is not relevant since the masking layer used for contact hole definition was formed in a single polysilicon layer, using two separate masks. Therefore the larger contact holes allow the use of larger conductive landing plugs, resulting in the use of easier process sequence, limited not by minimum spacing requirements, but only limited by layer to layer overlay.

Prior art, such as Ham, in U.S. Pat. No. 5,573,634, describes a method for forming contact holes in an insulator layer by double exposure of a single photoresist layer, using two masks. However that prior art does not show the use of two photoresist layers, and the use of two masks, resulting in the creation of the desired layout in a thin polysilicon layer, and than using the patterned polysilicon layer as the etch mask for contact hole definition.

SUMMARY OF THE INVENTION

It as an object of this invention to create a high density DRAM cell, using two photolithographic masks to create bit line contact holes, and capacitor node contact holes.

It is another object of this invention to create the interlaced bit line contact hole image, and capacitor node contact hole image, in a thin polysilicon layer, using a first photolithographic mask and a first photoresist layer, and to create the other interlaced bit line contact hole image, and storage node contact hole image, in the same thin polysilicon layer, using a second photolithographic mask, and a second photoresist layer.

It is still another object of this invention to use the patterned thin polysilicon layer as a mask for bit line contact hole, and for storage node contact hole, definition.

It is yet another object of this invention to achieve a spacing between a bit line contact hole and storage node contact hole, in the same active device region row, equal to about 0.4F, where F is equal to the minimum feature used in DRAM design.

It is still yet another object of this invention to achieve a spacing between a bit line contact hole in one active device region row, and a storage node contact hole of an adjacent second active device region row, equal to about 0.4F.

In accordance with the present invention a method for creating a DRAM cell, using a new bit line, and storage node contact hole design, and a novel method used to create this design, has been developed. An insulator layer is deposited on polycide gate structures, and source and drain regions. After planarization of the insulator layer a thin polysilicon layer is deposited. A first photolithographic mask, is used to expose a first interlaced pattern of bit line contact hole images, and capacitor node contact hole images, in a first photoresist layer. The first interlaced pattern of bit line contact hole images and capacitor node contact hole images, in the first photoresist layer is next transferred to the underlying thin polysilicon layer via an anisotropic reactive ion etch, (RIE), procedure. After removal of the first photoresist layer, a second photoresist layer is applied, and exposed, using a second photolithographic mask, creating a second interlaced pattern of bit line contact hole images, and storage node contact hole images in the second photoresist layer. The images in the second photoresist layer are than transferred to the underlying thin polysilicon layer, again via an anisotropic RIE procedure. After removal of the second photoresist layer, the patterned, thin polysilicon layer is used as a mask to allow the creation of bit line contact holes, and storage node contact holes, to be opened in the insulator layer, exposing active device regions. Deposition of a thick polysilicon layer, completely filling the bit line, and storage node contact holes, is followed by removal of the unwanted thick polysilicon layer, and the thin polysilicon layer, from the top surface of the insulator layer, creating polysilicon landing plugs in the bit line contact holes, and in the storage node contact holes. Formation of capacitor structures, overlying the polysilicon plugs, in the storage node contact holes, is followed by deposition of an interlevel insulator layer. A bit line via hole is formed in the interlevel insulator layer, followed by the formation of a metal bit line plug structure, contacting the polysilicon plug, which is located in the bit line contact hole. An overlying first level, metal interconnect structure, is formed contacting the underlying metal bit line plug structure.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The fabrication process used to create a high density DRAM cell, and design layout, using two independent photolithographic masks, to create bit line, and storage node, contact hole images in a polysilicon layer, and than using the patterned polysilicon layer as a mask to form the layout of bit line and storage node contact holes, will now be covered in detail. The DRAM cell described in this invention is comprised of N channel transfer gate transistors. If desired, this invention can be used to create a DRAM cell, comprised of P channel transfer gate transistors. This can be accomplished by creating an N well region, in the P type semiconductor substrate, and creating P type source and drain regions, in the semiconductor substrate, between polycide gate structures. This invention is also shown using a patterned polysilicon layer, as a mask for creation of the desired bit line and storage node contact holes, however if desired a material, such as a metal or a metal silicide, can be used in place of polysilicon.

Figure 1A:
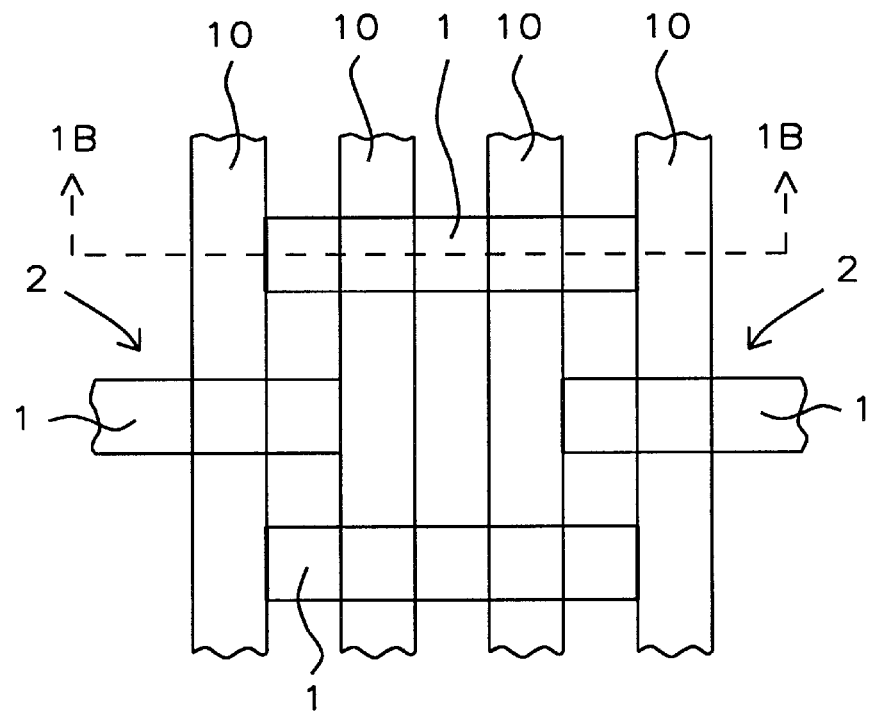
FIGS. 1A, 3A, and 4A, which schematically show the top view of the DRAM cell, at critical stages of fabrication.
Figure 1B:
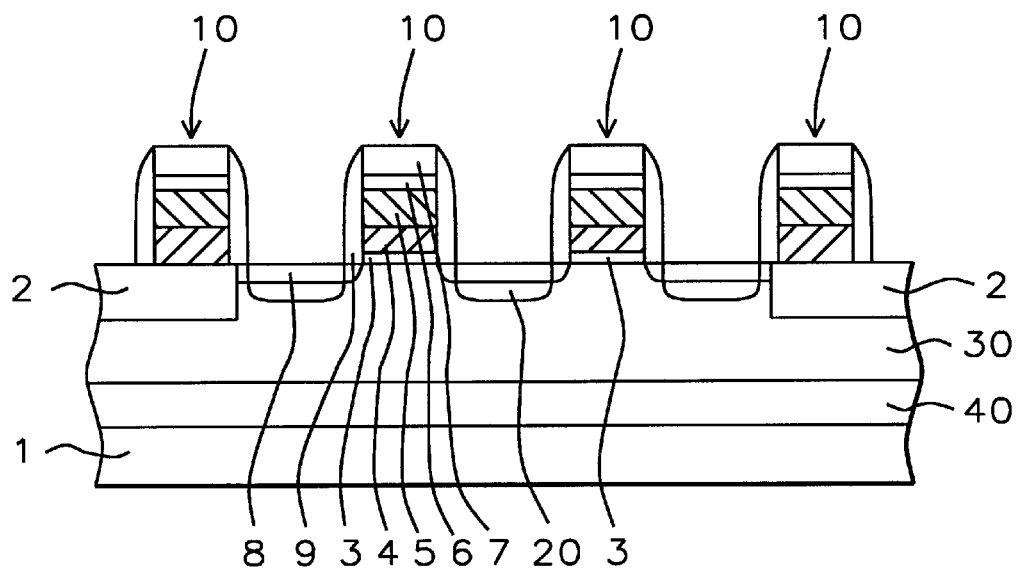
FIGS. 1B, 2, 3B, 4B, 5, 6, 7, 8, and 9, which schematically, in cross-sectional style, illustrate key stages of fabrication used to construct the DRAM cell.

FIG. 1A, schematically shows a top view of a DRAM cell, at a stage where insulator filled, shallow trench isolation, (STI), regions 2, have been formed in semiconductor substrate 1. Polycide gate structures, or word lines 10, are also shown, normal in direction to active device regions in semiconductor substrate 1. FIG. 1B, schematically shows the cross-sectional view of the DRAM cell, at this stage of fabrication. The P type, single crystalline silicon substrate 1, having a <100> crystallographic orientation, is shown in FIG. 1A. A P well region 30, used to supply the needed P type dopant concentration for subsequent N channel, metal oxide semiconductor field effect transistors, (MOSFET), as well as N type region 40, used to isolate the DRAM cell from semiconductor substrate 1, are formed using conventional photolithographic and ion implantation procedures. P well region 30, is formed via a boron ion implantation procedure, while deep N type region 40, is formed via a high energy phosphorous ion implantation procedure. In addition, a threshold adjust, ion implantation procedure, using implanted boron ions, is also performed in the DRAM cell region, and used to alter the channel doping characteristics near the surface of semiconductor substrate 1. The threshold adjust region, created in DRAM cell, is not shown in the drawings.

After removal of the photoresist shapes, used for creation of P well region 30, and for the creation of deep N type region 40, STI regions 2, are formed. This is accomplished by depositing a silicon nitride layer, on an underlying silicon oxide layer, followed by forming a photoresist masking shape, on the underlying silicon nitride layer, and using an anisotropic reactive ion etching, (RIE), procedure, to create the desired shallow trenches in silicon nitride, silicon oxide, and semiconductor substrate 1. The depth of the shallow trenches, in semiconductor substrate 1, is between about 1000 to 5000 Angstroms. After removal of the photoresist masking shape, via plasma oxygen ashing and careful wet cleans, a silicon oxide layer is deposited, via plasma enhanced chemical vapor deposition, (PECVD), or low pressure chemical vapor deposition, (LPCVD), procedures, completely filling the shallow trenches. A chemical mechanical polishing, (CMP), procedure is used to remove unwanted silicon oxide, from the top surface of the silicon nitride layer, followed by the removal of silicon nitride, and silicon oxide layer, resulting in insulator filled, STI regions 2, schematically shown in the top view in FIG. 1A. and in cross-sectional view of FIG. 1B.

Creation of polycide gate structures 10, are next addressed. A thin silicon dioxide layer 3, is thermally grown in an oxygen-steam ambient, to a thickness between about 40 to 150 Angstroms, to be used for the gate insulator layer, of the DRAM cell. Next a polysilicon layer 4, is deposited via LPCVD procedures, to a thickness between about 500 to 1000 Angstroms. Polysilicon layer 4, can be doped N type, during an in situ doping, deposition procedure, or polysilicon layer 4, can be deposited intrinsically and doped using either phosphorous or arsenic, ion implantation procedures. A titanium disilicide layer 5, is formed on polysilicon layer 4, at a thickness between about 500 to 1200 Angstroms, via a LPCVD procedure. A layer of silicon oxide 6, is next deposited via LPCVD or PECVD procedures, at a thickness between about 100 to 500 Angstroms, followed by the deposition of overlying silicon nitride 7, again using PECVD or LPCVD procedures, to a thickness between about 1000 to 3000 Angstroms. Polycide, (titanium disilicide on polysilicon), gate structures 10, capped with silicon nitride layer 7, and silicon oxide layer 6, are then formed via photolithographic and anisotropic RIE procedures, using $CHF_3$ as an etchant for silicon nitride layer 7, and for silicon oxide layer 6, while $Cl_2$ is used as an etchant for titanium disilicide layer 5, and for polysilicon layer 4.

After removal of photoresist shapes that were used as an etch mask for polycide gate formation, via plasma oxygen ashing and careful wet cleans, a lightly doped source and drain region 8, is formed via ion implantation of arsenic or phosphorous, at an energy between about 5 to 50 KeV, at a dose between about 1E12 to 5E13 atoms/$cm^2$. Next a silicon nitride layer is deposited, via an LPCVD or a PECVD procedure, to a thickness between about 500 to 1000 Angstroms, followed by an anisotropic RIE procedure, using $CHF_3$ as an etchant, creating silicon nitride spacers 9, on polycide gate structures 10. A heavily doped source and drain region 20, is then via an ion implantation procedure, using arsenic or phosphorous ions, at an energy between about 5 to 50 KeV, and at a dose between about 1E15 to 5E15 atoms/cm$^2$. The result of these procedures are schematically shown in FIG. 1B.

Figure 2:
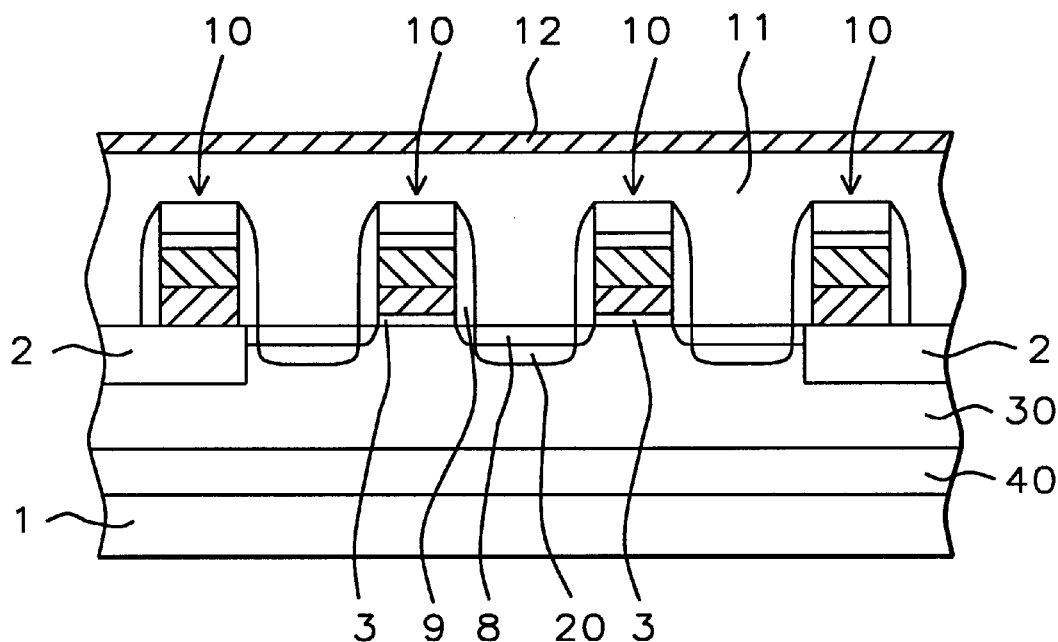
Figure 3A:
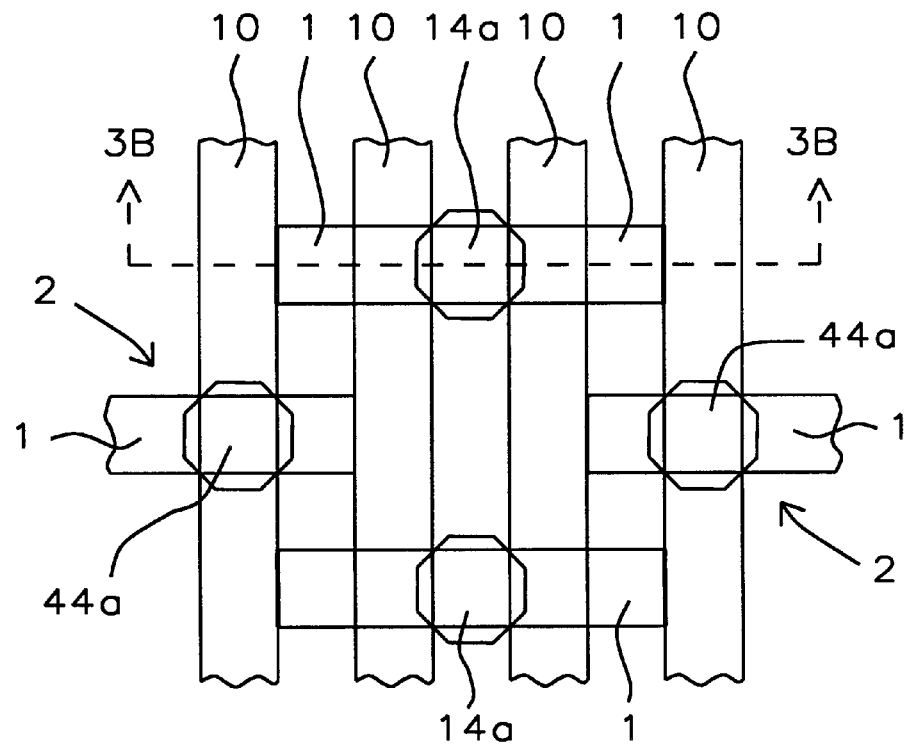
Figure 3B:
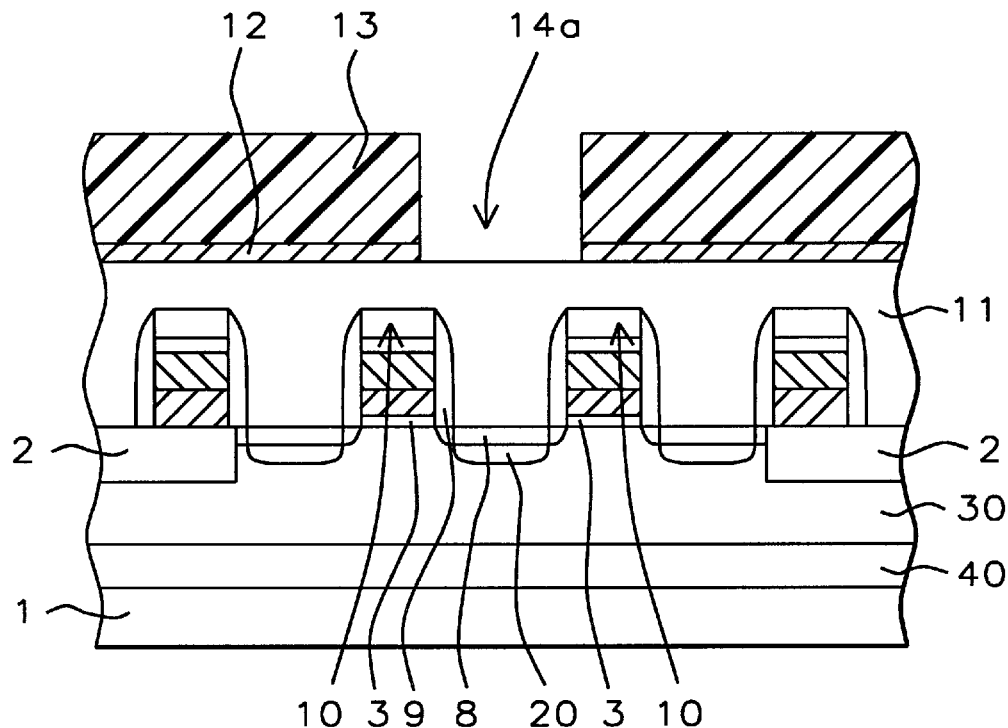

A silicon oxide layer 11, is next deposited using LPCVD or PECVD procedures, to a thickness between about 2000 to 8000 Angstroms. A chemical mechanical polishing, (CMP), procedure, is next employed for planarization purposes, creating a smooth top surface topology for silicon oxide layer 11. A thin polysilicon layer 12, is then deposited using LPCVD procedures, to a thickness between about 300 to 2000 Angstroms, schematically illustrated in FIG. 2. FIGS. 3A, and 3B, will now address the first phase of creating bit line contact holes and capacitor node contact holes. A photoresist shape 13, featuring opening 44a, for subsequent capacitor node contact holes, and 14a, for subsequent bit line contact holes, is created via exposure using a first photolithographic mask, followed by development of the exposed portions of the photoresist layer. Photoresist shape 13, is then used as a etch mask to transfer openings 14a, and openings 44a, in photoresist shape 13, to the underlying thin polysilicon layer 12. This is accomplished via an anisotropic RIE procedure, using $Cl_2$ as an etchant, and shown schematically in cross-sectional style in FIG. 3B, and shown schematically in the top view of FIG. 3A. The diameter of opening 14a, and opening 44a, which will subsequently translate to the bit line contact hole, and the capacitor node contact hole, respectfully, is between about 1.2 to 2.5F, or between about 1.2 to 2.5 times the minimum feature used for this DRAM cell. Therefore, if the minimum feature used for the DRAM cell, for example is 0.50 uM, the diameter of opening 14a, and opening 44a, would be between about 0.60 to 1.25 uM. The design of a specific DRAM cell, or layout, is comprised of a bit line structure, in the center of an active device region of the semiconductor substrate, placed between polycide gate structures. This is shown schematically in FIG. 3A.

Figure 4A:
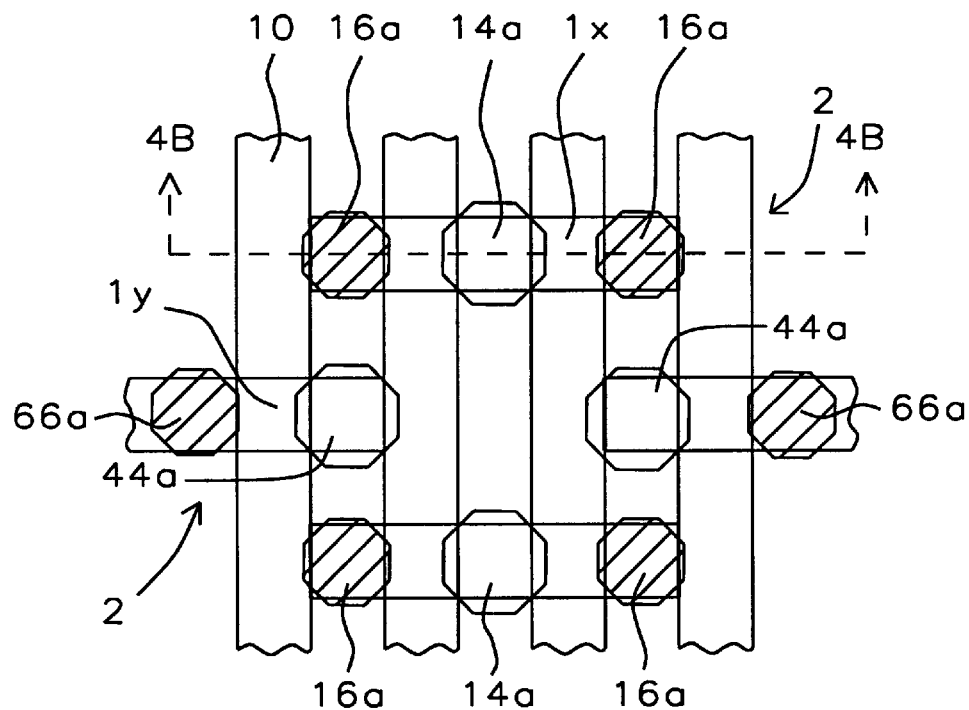
Figure 4B:
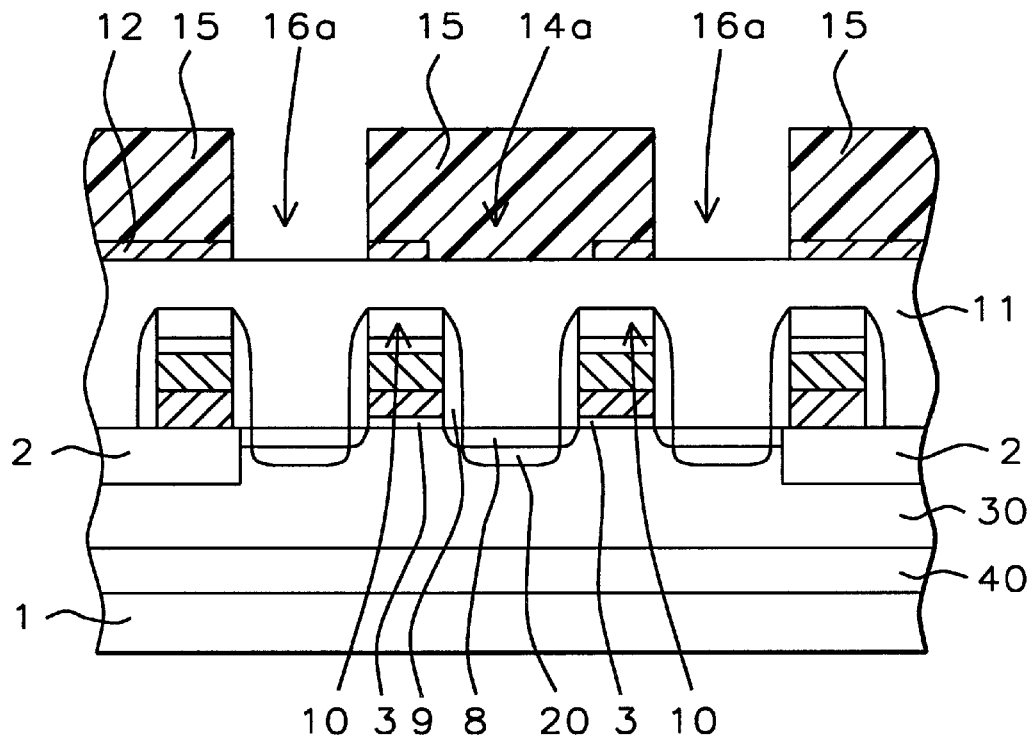

After removal of photoresist shape 13, via plasma oxygen ashing and careful wet cleans, photoresist shape 15, is formed, featuring openings 16a, exposing the top surface of unetched thin polysilicon layer 12. The same anisotropic RIE procedure, using $Cl_2$ as an etchant, is used to transfer opening 16a, in photoresist shape 15, to the thin polysilicon layer 12. This is schematically shown, in cross-sectional style in FIG. 4B. The top view of the DRAM cell, at this stage of processing in shown schematically in FIG. 4A. (Openings 16a, and openings 66a, have been hashed in the top view drawings for purposes of clarity). Openings 16a, subsequently to translate to capacitor node contact holes, and openings 66a, subsequently to translate to bit line contact holes, have a diameter between about 1.2 to 2.5F, or again if the minimum feature used is 0.50 uM, the diameter of opening 16a, and of opening 66a, is between about 0.60 to 1.25 uM. The design of this DRAM cell will place two capacitor structures, or two capacitor node contact hole opening 16a, in each active device region, one on each side of opening 14a, or the bit line opening 14a, between polycide gate structures. The space between bit line opening 14a, and capacitor node contact opening 16a, in the same active device region is only between about 0.3 to 0.8F, or between about 0.15 to 0.40 uM. This again is accomplished via the use of two individual masks, and is dependent on the overlay between the masks, not the minimum spacing allowable, which would be the case if opening 14a, and opening 16a, were formed using a single mask and one photolithographic procedure. Still referring to FIG. 4A, the space between a bit line contact hole opening 14a, in active device region 1x, and the nearest capacitor node contact hole opening 44a, located in active device region 1y, is about 1–3F, or 0.5–1.5 uM, while the space between a capacitor node opening 16a, in active device region 1x, and the nearest capacitor node opening 44a, in active device region 1y, is between about 0.3 to 0.8F, or about 0.3 uM. The space between a bit line contact opening, in one active device region, to a bit line contact opening, in a second, or nearest active device region, is between about 1.5 to 2.5F. The octagon shape for all contact holes is used to obtain a larger photolithographic process window.

Figure 5:
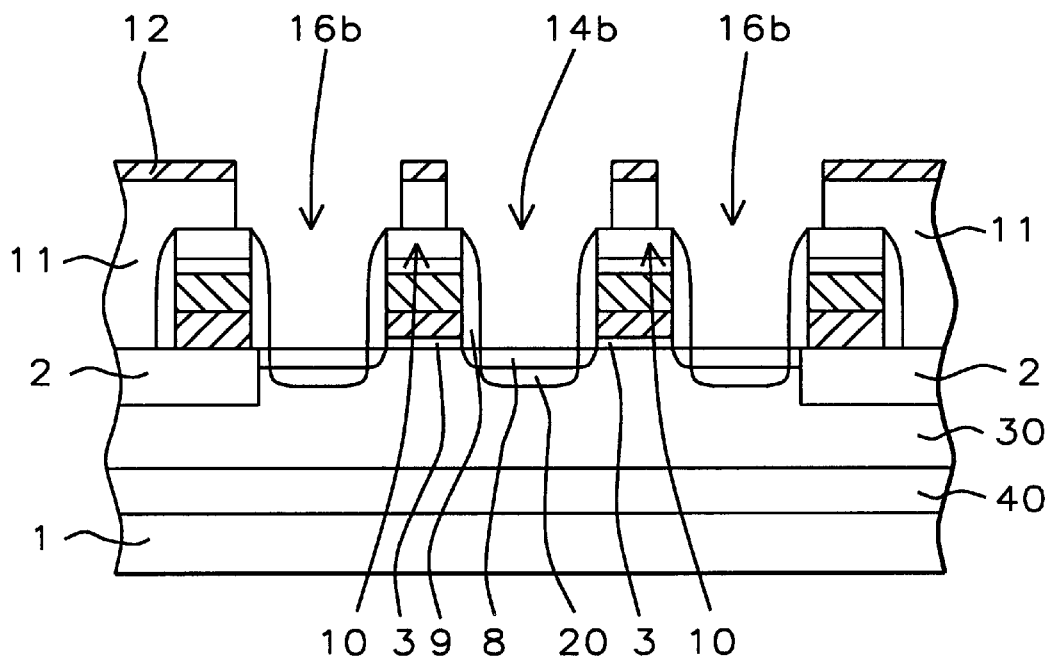

After removal of photoresist shape 15, via plasma oxygen ashing and careful wet cleans, thin polysilicon layer 12, now featuring bit line contact holes openings 14a, and 66a, and capacitor node contact hole openings 16a, and 44a, is used as a mask to create capacitor node contact hole 16b, and bit line contact holes 14b, in insulator layer 11. This is accomplished using an anisotropic RIE procedure using $CHF_3$ as an etchant, with $CHF_3$ being selective in regards to a large etch rate ratio between silicon oxide to polysilicon. The result of this procedure is schematically shown in FIG. 5. The diameter of capacitor node contact holes 16b, and bit line contact holes 14b, are identical to diameters for opening 16a, and opening 14a, respectfully.

Figure 6:
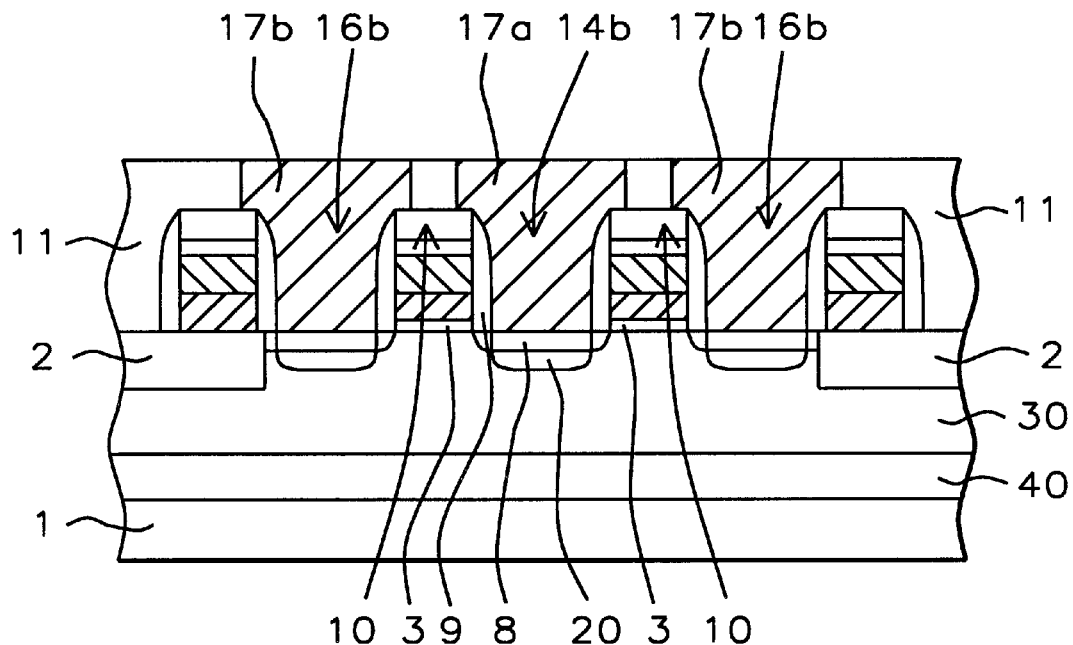

A thick polysilicon layer is next deposited, using LPCVD procedures, to a thickness between about 1000 to 6000 Angstroms, completely filling capacitor node contact holes 16b, and bit line contact holes 14b. The thick polysilicon layer can be in situ doped N type, during deposition, or the thick polysilicon layer can be deposited intrinsically and then doped via N type, ion implantation procedures. A CMP procedure is next used to completely remove unwanted regions of the thick polysilicon layer, and thin polysilicon layer 12, from the top surface of insulator layer 11, resulting in polysilicon landing plug 17a, in bit line contact hole 14b, and polysilicon landing plugs 17b, in capacitor node contact holes 14b. This is schematically shown in FIG. 6. The removal of unwanted polysilicon can also be accomplished using a selective RIE procedure, using $Cl_2$ as an etchant. The polysilicon landing plugs have the same dimensions as the contact holes they are located in, with the spaces between plugs, identical to the spaces between openings, previously described.

Figure 7:
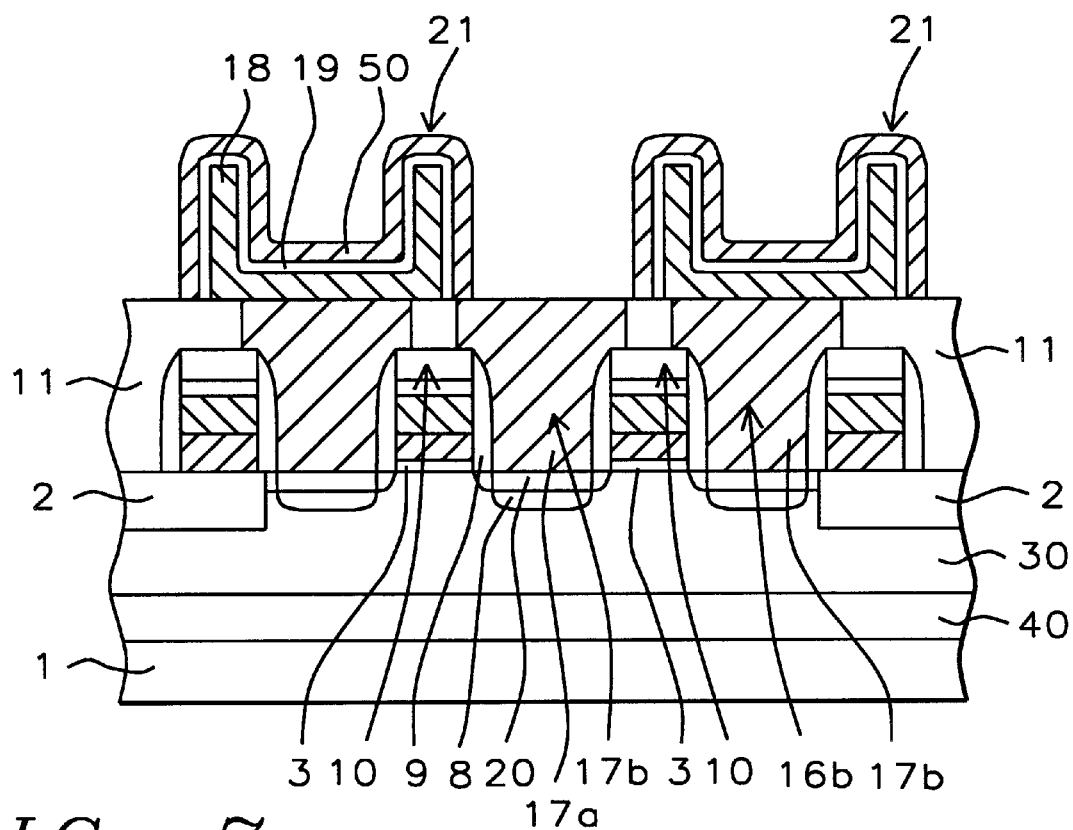

FIG. 7, schematically shows capacitor structures 21, overlying, and contacting polysilicon landing plugs 17b. The storage node structure 18, of capacitor structure 21, is formed by initially depositing a first polysilicon layer, followed by an overlying insulator layer. After patterning of the insulator layer, creating an insulator shape on the underlying first polysilicon layer, a second polysilicon layer is deposited. An anisotropic RIE procedure, using $Cl_2$ as an etchant is used to pattern the second polysilicon layer creating polysilicon spacers on the sides of the insulator shape. This RIE procedure also removes first polysilicon layer from the top surface of insulator layer 11, in regions in which the insulator shape did not overlay insulator layer 11. Selective removal of the insulator shape results in the storage node structure 18, comprised of vertical, second polysilicon shapes, connected by a horizontal, first polysilicon shape. A capacitor dielectric layer 19, comprised of a $Ta_2O_5$ layer, or a ONO, Oxidized silicon Nitride on Oxide, layer, at an equivalent silicon oxide thickness between about 40 to 300 Angstroms, is next formed on capacitor node structure 18. Finally a polysilicon upper plate, or cell plate 50, is formed via deposition and patterning of a polysilicon layer.

Figure 8:
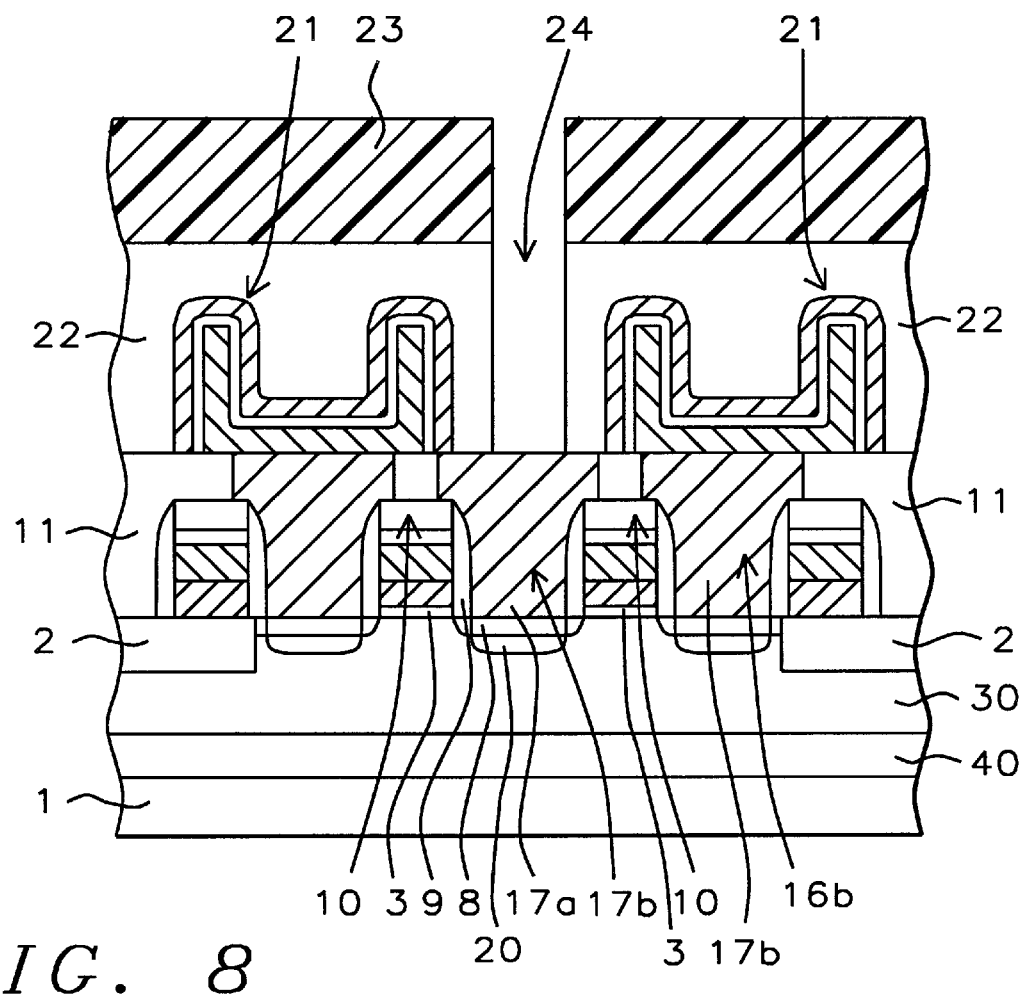
Figure 9:
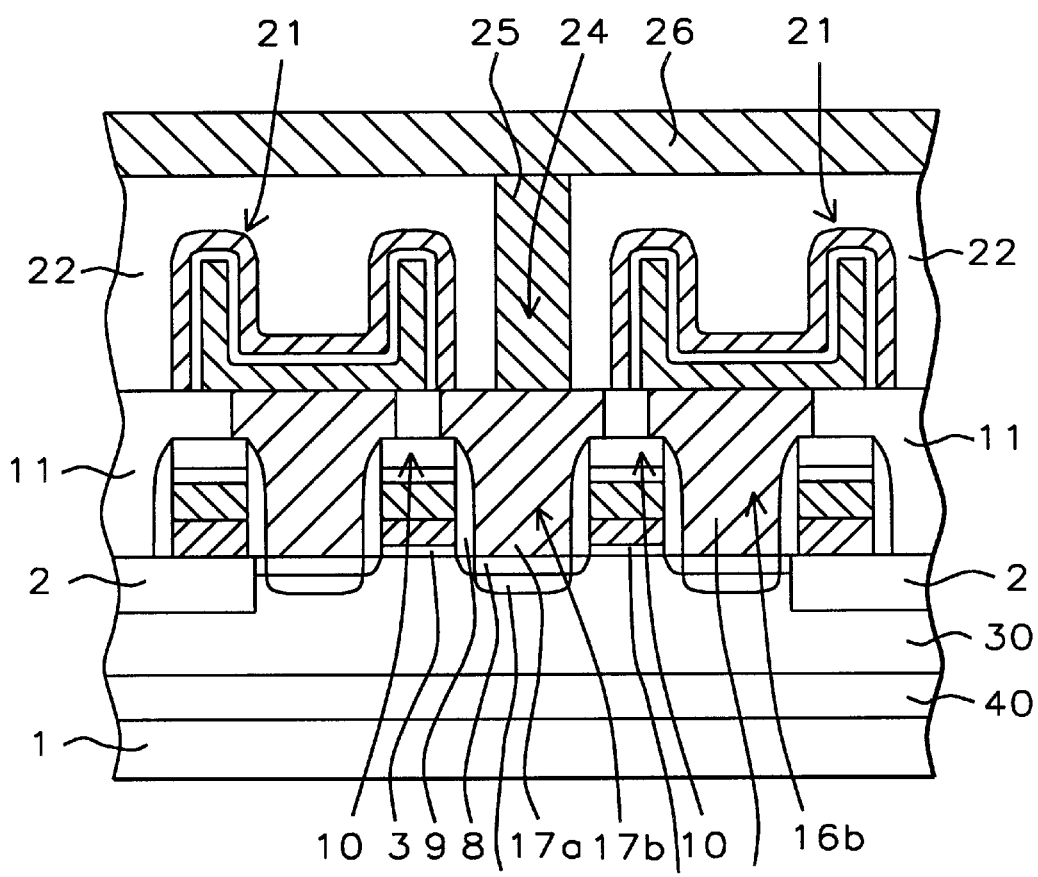

An interlevel insulator layer 22, of silicon oxide, is deposited using LPCVD or PECVD procedures, to a thickness between about 5000 to 15000 Angstroms. Interlevel insulator layer 22, can also be a boro-phosphosilicate layer, or a phosphosilicate layer, if desired. A chemical mechanical polishing procedure is performed to create a smooth top surface topography, for interlevel insulator layer 22. This is schematically shown in FIG. 8. Contact hole 24, to accept a subsequent metal plug structure, is next formed, using photoresist shape 23, as an etch mask. An anisotropic RIE procedure, using $CHF_3$ as an etchant, is used to open via hole 24, exposing the top surface of polysilicon landing plug 17a, schematically shown in FIG. 8. After removal of photoresist shape 23, via plasma oxygen ashing and careful wet cleans, a tungsten layer is deposited, via LPCVD or R.F. sputtering procedures, to a thickness between about 1000 to 5000 Angstroms. unwanted tungsten, on the top surface of interlevel insulator layer 22, is removed via chemical mechanical polishing, or via an anisotropic, selective RIE procedure, using $Cl_2$ as an etchant, creating tungsten plug 24, located in via hole 24. First metal interconnect structure 26, is next formed, via R.F. sputtering of an aluminum based layer, containing between about 0 to 2.0% copper, to a thickness between about 1000 to 5000 Angstroms, followed by patterning of the aluminum based layer, via photolithographic and anisotropic RIE procedures. First metal interconnect structure 26, or bit line structure 26, is schematically shown in FIG. 9.

While this invention has been particularly shown and described with reference to the preferred embodiments thereof, it will be understood by those skilled in the art that various changes in form and details may be made without departing from the spirit and the scope of this invention.

What is claimed is:

1. A DRAM cell, on a semiconductor substrate, comprising:

insulator filled shallow trench regions, in said semiconductor substrate;

active device regions, in said semiconductor substrate, between said insulator filled shallow trench regions;

polycide gate structures traversing said DRAM cell, in a direction normal to the length of said active device regions, overlying and contacting said active device regions, in said semiconductor substrate;

source and drain regions, in regions of said active device regions, not covered by said polycide gate structures;

a bit line contact hole, in an insulator layer, between a second polycide gate structure, and a third polycide gate structure, exposing a first source and drain region, located in the center of a first active device region;

a first capacitor node contact hole, in said insulator layer, between a first polycide gate structure, and said second polycide gate structure, exposing a second source and drain region, in said first active device region, and located to the left of said bit line contact hole, with a spacing between said first capacitor node contact hole, and said bit line contact hole, between about 0.3 to 0.8F, where F is equal to the dimension of the minimum feature used for said DRAM cell;

a second capacitor node contact hole, in said insulator layer, between said third polycide gate structure, and a fourth polycide gate structure, exposing a third source and drain region, in said first active device region, and located to the right of said bit line contact hole, with the spacing between said second capacitor node contact hole, and said bit line contact hole, between about 0.3 to 0.8F;

multiple active device regions, in regions of said semiconductor substrate, not covered by said insulator filled shallow trenches, comprised of polycide gate structures, source and drain regions, capacitor node contact holes and bit line contact holes, with the spacing between said capacitor node contact hole, in said first active device region, and the nearest bit line contact hole, of the nearest active device region, between about 0.3 to 0.8F, while the spacing between a capacitor node contact hole, in said first active device region, and the nearest capacitor node contact hole, in a nearest active device region, is between about 0.3 to 0.8F, and the spacing between a bit line contact hole, in said first active device region, and the nearest bit line contact hole, in a nearest active device region, is between about 1.5 to 2.5F;

polysilicon landing plugs in capacitor node contact holes, and in bit line contact hole, in said first active device region;

capacitor structures, overlying and contacting the top surface of the polysilicon landing plugs, located in said capacitor node contact holes;

a tungsten plug, overlying and contacting, the top surface of a polysilicon landing plug, located in said bit line contact hole; and a metal interconnect structure, overlying and contacting the top surface of said tungsten plug.

2. The DRAM cell of claim 1, wherein said capacitor node contact holes, in said insulator layer, at a depth between about 2000 to 8000 Angstroms, have a diameter between about 1.2 to 2.5F, where F is equal to the minimum dimension used for said DRAM cell.

3. The DRAM cell of claim 1, wherein said bit line contact holes, in said insulator layer, at a depth between about 2000 to 8000 Angstroms, have a diameter between about 1.2 to 2.5F, where F is equal to the minimum dimension used for said DRAM cell.

4. The DRAM cell of claim 1, wherein said polycide gate structures are comprised of a titanium disilicide layer, at a thickness between about 500 to 1200 Angstroms, and an underlying polysilicon layer, at a thickness between about 500 to 1000 Angstroms.

* * * * *